(12) United States Patent
Barrera et al.

(10) Patent No.: US 6,561,796 B1
(45) Date of Patent: May 13, 2003

(54) METHOD OF SEMICONDUCTOR WAFER HEATING TO PREVENT BOWING

(75) Inventors: Martin M. Barrera, Santa Clara, CA (US); George Kamian, Santa Cruz, CA (US); Edward J. McInerney, San Jose, CA (US); Craig L. Stevens, Ben Lomond, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/655,753

(22) Filed: Sep. 6, 2000

Related U.S. Application Data
(60) Provisional application No. 60/152,668, filed on Sep. 7, 1999.

(51) Int. Cl.[7] ................................................. F27D 5/00
(52) U.S. Cl. ........................... 432/5; 211/41.18; 118/50
(58) Field of Search .......................... 432/5–10, 241, 432/249, 253; 211/41.18; 414/939, 940; 438/978; 118/50–724

(56) References Cited

U.S. PATENT DOCUMENTS

| | | | |
|---|---|---|---|
| 5,343,012 A | | 8/1994 | Hardy et al. ................. 219/443 |
| 5,665,166 A | * | 9/1997 | Deguchi et al. ............. 118/724 |
| 5,716,207 A | * | 2/1998 | Mishina et al. .............. 432/253 |
| 5,766,824 A | | 6/1998 | Batchelder et al. ......... 430/330 |
| 5,837,555 A | * | 11/1998 | Kaltenbrunner et al. .... 432/253 |
| 5,972,114 A | * | 10/1999 | Yonenaga et al. ........... 118/724 |
| 6,143,077 A | * | 11/2000 | Ikeda et al. .................. 118/724 |
| 6,258,174 B1 | * | 7/2001 | Matsumoto et al. ........ 118/724 |
| 6,276,072 B1 | * | 8/2001 | Morad et al. ................ 432/253 |
| 6,290,491 B1 | * | 9/2001 | Shahvandi et al. ............ 432/5 |

FOREIGN PATENT DOCUMENTS

| | | |
|---|---|---|
| EP | 0 435 568 A2 | 7/1991 |
| EP | 0 693 774 A2 | 1/1996 |
| WO | 01/29879 | 4/2001 |

* cited by examiner

*Primary Examiner*—Gregory Wilson
(74) *Attorney, Agent, or Firm*—Roland Tso

(57) ABSTRACT

Bowing of semiconductor wafers during heating is reduced by heating the wafers in a gas with a thermal conductivity and mean free path greater than that of oxygen, or by heating the wafers in a processing chamber under a pressure less than 0.1 Torr. In one embodiment, the high thermal conductivity gas is helium and heating in the helium takes place at a pressure less than 2.4 Torr.

12 Claims, 7 Drawing Sheets

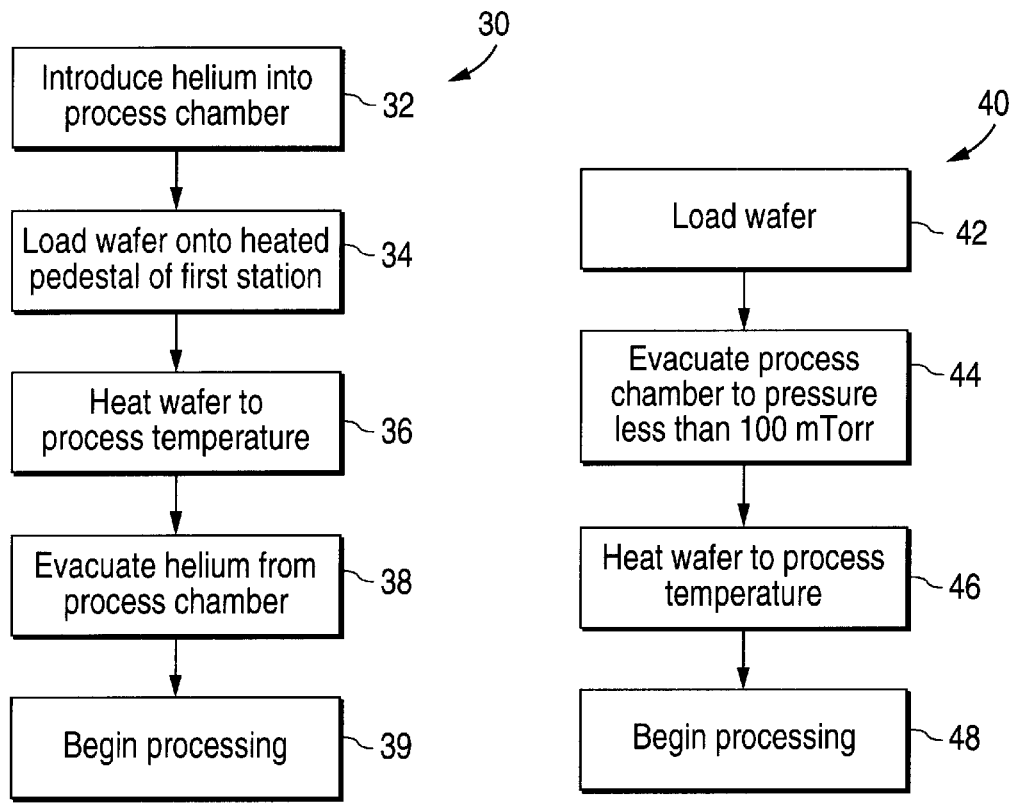
FIG. 3A
FIG. 4A
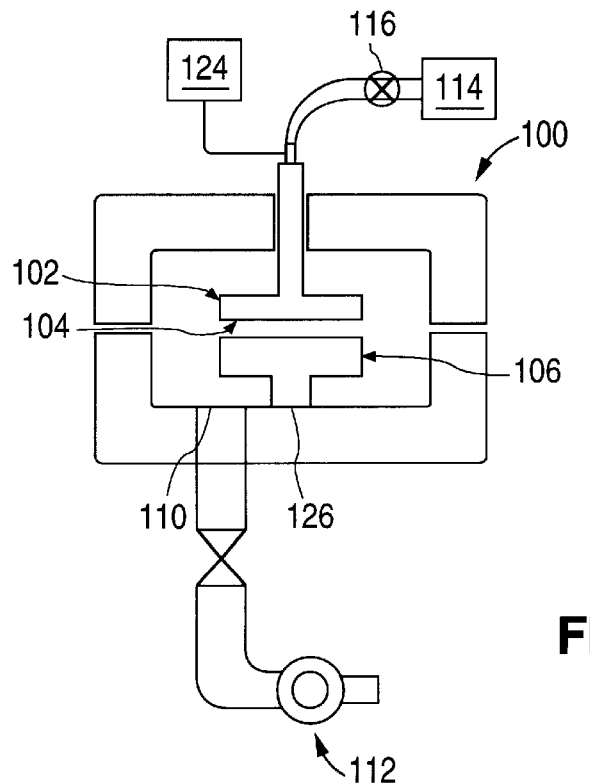
FIG. 5

METHOD OF SEMICONDUCTOR WAFER HEATING TO PREVENT BOWING

CROSS-REFERENCE TO RELATED APPLICATION

This application claims priority from U.S. Provisional Patent Application No. 60/152,668, "Method of Semiconductor Wafer Heating to Prevent Bowing," filed on Sep. 7, 1999. U.S. Provisional Patent Application No. 60/152,668 is incorporated herein in its entirety by this reference.

BACKGROUND

Semiconductor devices are fabricated by depositing layers of semiconductor films and metal interconnects. The layers may be deposited using a multistation sequential deposition system. In a multistation sequential deposition system, multiple silicon wafers are processed sequentially, receiving a portion of the total deposition thickness of a given layer at separate stations in the system. As wafers move to successive stations, a new wafer is introduced to the process chamber while a completed wafer is removed. When a new wafer is introduced at the first station, the wafer is heated to process temperature at the first station before processing begins.

When a new wafer is placed on the pedestal at the first station, the difference between the temperature of the wafer and the temperature of the heated pedestal can cause the wafer to deform. For example, 300 mm silicon wafers have been observed to bow when placed upon a heated pedestal in a multistation deposition system in a vacuum based process chamber. FIGS. 1A–1C show a wafer warping on a heated pedestal in a deposition system. FIG. 1A shows the system at time 0, just after wafer 12 has been placed on pedestal 10. Wafer 12 has a center 12a and an edge, 12b. At time 0, both center 12a and edge 12b of wafer 12 contact pedestal 10. FIG. 1B shows the system at time t1, after wafer 12 has been heating for time t1. Wafer 12 has bowed so that center 12a still contacts pedestal 10, but edge 12b has lifted off pedestal 10 by a distance 14. Distance 14 may be about 0.08 inches between the edge of wafer 12 and pedestal 10. FIG. 1C shows the system at time t2, after wafer 12 has been heating for time t2. The wafer has now heated up enough that the wafer has relaxed from the bowed state shown in FIG. 1B. Once a wafer has bowed, it may take 80–120 seconds for the wafer to heat up enough from the heated pedestal to relax.

One cause of the warping is nonuniform heating of the wafer. FIG. 2A shows a graph 20 with two curves, one (21) showing the temperature of the center of the wafer and one (22) showing the temperature of the edge of the wafer at a given time after the wafer is placed on heated pedestal 10 of FIG. 1. The wafer in FIG. 2A is heated in oxygen. FIG. 2A shows that the center of the wafer heats much more quickly than the edge of the wafer. FIG. 2B shows the temperature difference between the center and the edge of the wafer at a given time after the wafer is placed on the pedestal (curve 26). The temperature difference peaks at about 130 degrees Celsius about ten seconds after the wafer is placed on the pedestal. This temperature difference causes the hot center of the wafer to expand more quickly than the cooler edges. As a result, the wafer warps.

If the wafers are not flat on the pedestal when processing starts, a layer of material can be deposited on the under side of the wafer, which would touch the pedestal if the wafer were not warped. Also, the warping of wafers may affect the uniformity of the layer deposited. Backside deposition and nonuniform deposition are unacceptable because they may harm the operating characteristics of the device. Thus, the wafers must be allowed to sit on the heated pedestal long enough for the wafers to relax before processing can begin. It may take 80 to 120 seconds for the wafers to relax. Thus, allowing the wafer to relax on the pedestal takes time that decreases processing throughput. One alternative method of preventing backside deposition and nonuniform deposition is to prevent wafer bowing by clamping the wafer to the pedestal during the heating. As the clamped wafer heats up and expands, the contact force between the wafer and the pedestal created by the clamp causes small scratches on the backside of the wafer and causes the backside of the wafer to pick up particles from the pedestal. Such scratches and particles on the back side of the wafer are undesirable as they can affect the thickness of the wafer, which can cause depth-of-focus inaccuracies in subsequent photolithography steps.

SUMMARY

A method is provided for reducing the amount of bowing in a wafer when the wafer is heated to processing temperature and for reducing the amount of time required to heat the wafer to processing temperature. In one embodiment, before the wafer is loaded on the heated pedestal for processing, a heat transfer gas with a thermal conductivity and mean free path greater than that of oxygen, such as helium, is introduced into the processing chamber. The wafer is then loaded and heated in heat transfer gas. In another embodiment, the wafer is loaded on the heated pedestal, then the contents of the processing chamber are evacuated until the chamber is at a pressure of less than 0.1 Torr. The wafer is then heated to process temperature in the low pressure environment.

BRIEF DESCRIPTION OF THE DRAWINGS

FIG. 3A illustrates, in a flowchart, a first embodiment of the invention.

FIG. 4A illustrates, in a flowchart, a second embodiment of the invention.

FIG. 5 illustrates an example of a processing chamber suitable for implementing the present invention.

DETAILED DESCRIPTION

Figure 1A:
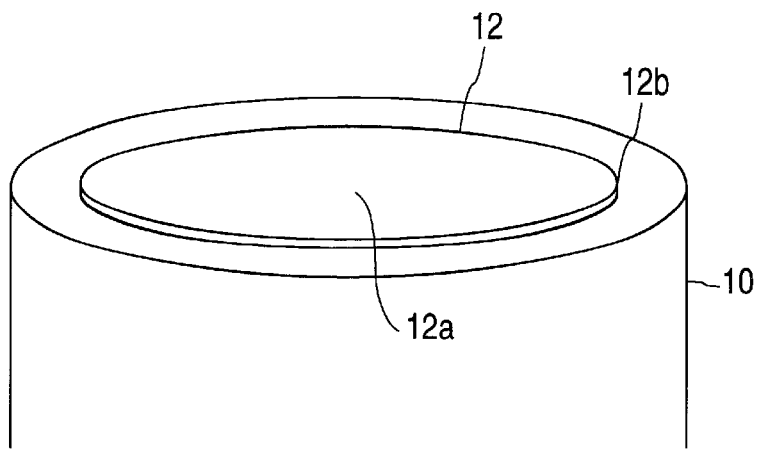
FIG. 1A illustrates a wafer on a pedestal at time zero, just after the wafer is loaded on the pedestal.
Figure 1B:
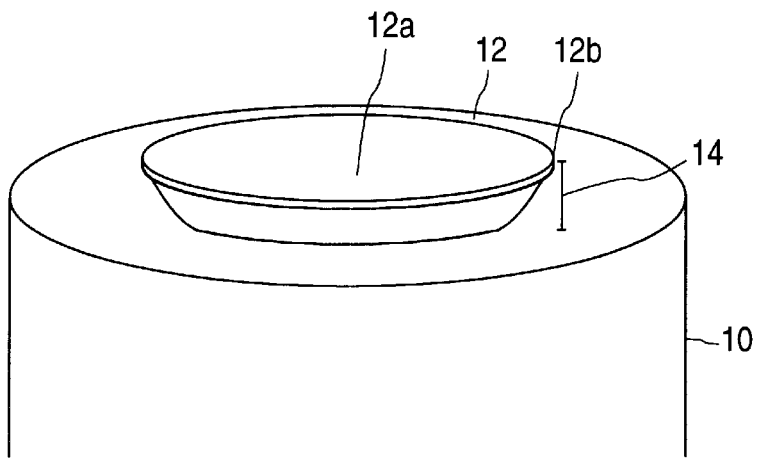
FIG. 1B illustrates a wafer on a pedestal after a heating time t1 has elapsed.
Figure 1C:
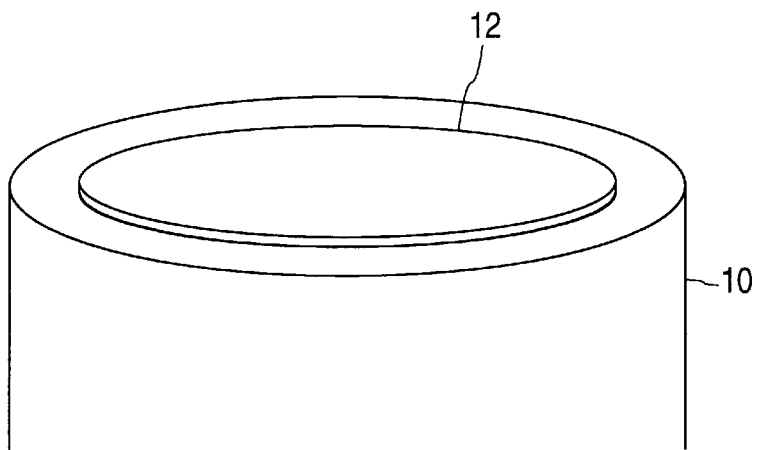
FIG. 1C illustrates a wafer on a pedestal after a heating time t2 has elapsed.

FIG. 3A illustrates, in a flowchart, a first embodiment 30 of the present invention. In stage 32, a heat transfer gas with a heat transfer coefficient and mean free path greater than that of oxygen, such as helium, is introduced into the process chamber. In one embodiment, the heat transfer gas is added to the process chamber at a rate of 10 liters per minute or less, and the pressure within the process chamber is 2.4 Torr or less. In stage 34, a wafer is loaded onto the heated pedestal of the first station. The wafer is then heated to process temperature in stage 36. The heat transfer gas is evacuated from the process chamber in stage 38. After the heat transfer gas is evacuated, processing begins in stage 39.

Table 1 lists the thermal conductivity of several gases at 300K:

TABLE 1

| Gas | Thermal Conductivity in mW/mK |
|---|---|
| He | 156.7 |
| $O_2$ | 26.0 |
| $N_2$ | 26.3 |

Two properties of the heat transfer gas used to heat the wafer are important: the thermal conductivity of the gas, represented by the heat transfer coefficient, and the mean free path of the gas. The wafer is heated primarily by conduction across the small gap between the wafer and pedestal. The heat flux to the wafer depends on the conductivity of the gas, the size of the gap, and the temperature difference between pedestal and wafer, given by:

$$q = \frac{k}{\Delta x} \Delta T$$

where k is the thermal conductivity of the gas.

The gap $\Delta x$ between the wafer and pedestal is typically about a few thousandths of an inch and depends on the roughness of the surfaces and how warped they are. Because the gap is small, the heat flux to the wafer can be severely affected by slight warp in the wafer. For instance, if the average gap is 0.004 inches at the center and the wafer is initially bowed by 0.004 inches, the edge of the wafer will get only ½ the heat of the center, leading to a large temperature gradient in the wafer and serious wafer bowing.

The mean free path of the gas, that is, the distance a gas molecule travels before it hits another gas molecule, is large compared to the typical gap at typical process pressures. This affects the heat transfer and requires the above equation to be modified. For small gaps, the heat flux is given by:

$$q = \frac{k}{G_{eff}} \Delta T,$$

where $G_{eff}$ is the effective gap given by:

$$G_{eff} = \Delta x + 2m\lambda,$$

where $\lambda$ is the mean free path and m depends on the gas type and surface conditions, generally ranging between 1 and 4. This theory of heat transfer was developed by A. Hasper, J. E. J. Schmitz, J. Holleman, and J. F. Verwey, "Heat Transport in Cold Wall Single Wafer Low Pressure Chemical Vapor Deposition Reactors, JVST A v10,1992, 3193–3202.

In order to heat wafers quickly, $k/G_{eff}$ must be as large as possible. A large $k/G_{eff}$ results in high heat flux to the wafer, which prevents bowing by promoting even heating. The value of k should be large and the value of $G_{eff}$ small to maximize $k/G_{eff}$. If a large $k/G_{eff}$ is achieved by making the gap between the wafer and the pedestal small, the wafer is susceptible to wafer bowing due to the temperature gradients discussed above. Thus, the mean free path of the gas selected for heating must be large, such that it minimizes the effect of the gap between the wafer and the pedestal. That allows fast heat up without the sensitivity to any slight warps that may be present in the unheated wafer.

Figure 6A:
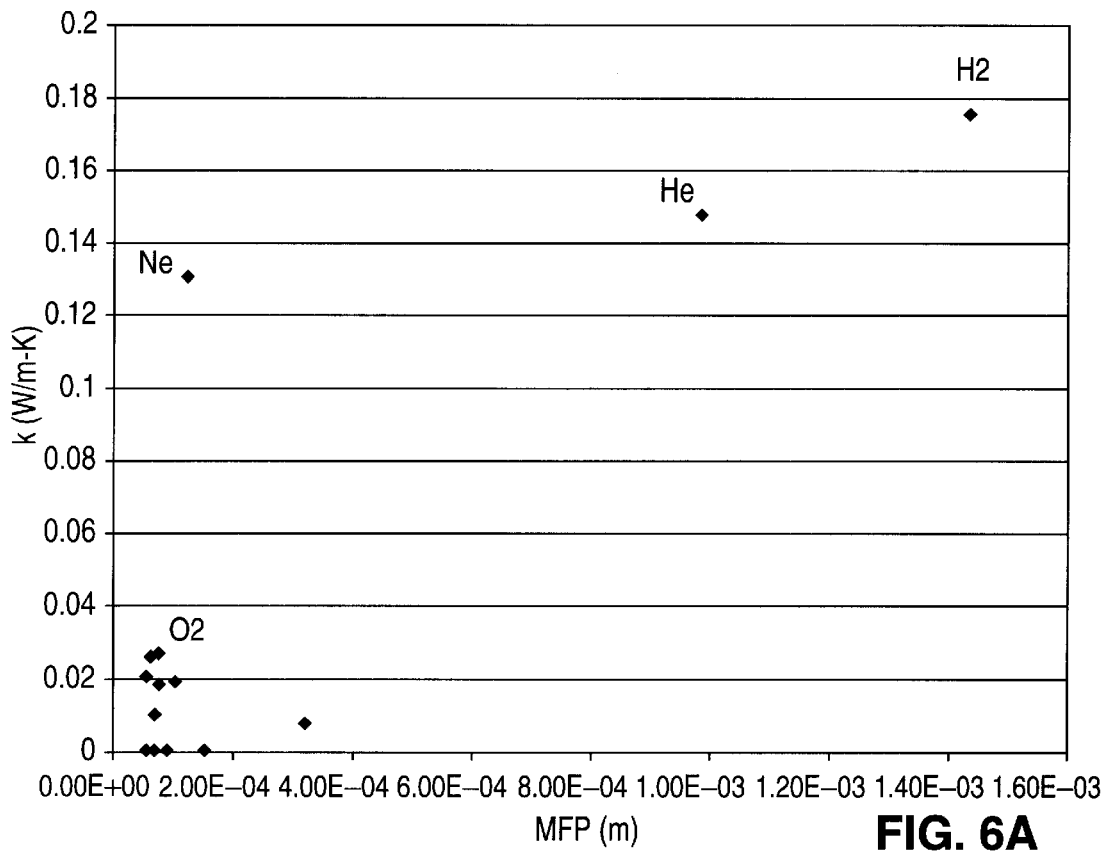
FIG. 6A is a plot of heat transfer coefficient vs. mean free path for several gases at 2.6 Torr.
Figure 6B:
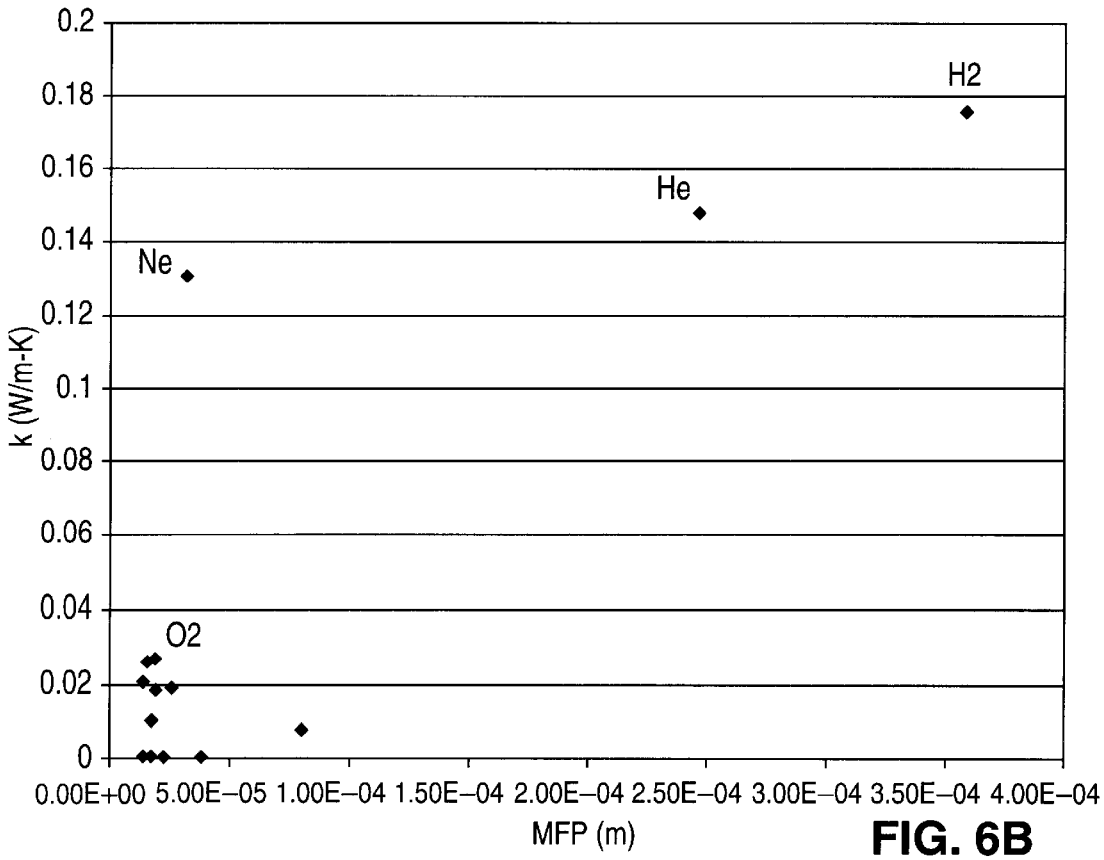
FIG. 6B is a plot of heat transfer coefficient vs. mean free path for several gases at 10 Torr.
Figure 6C:
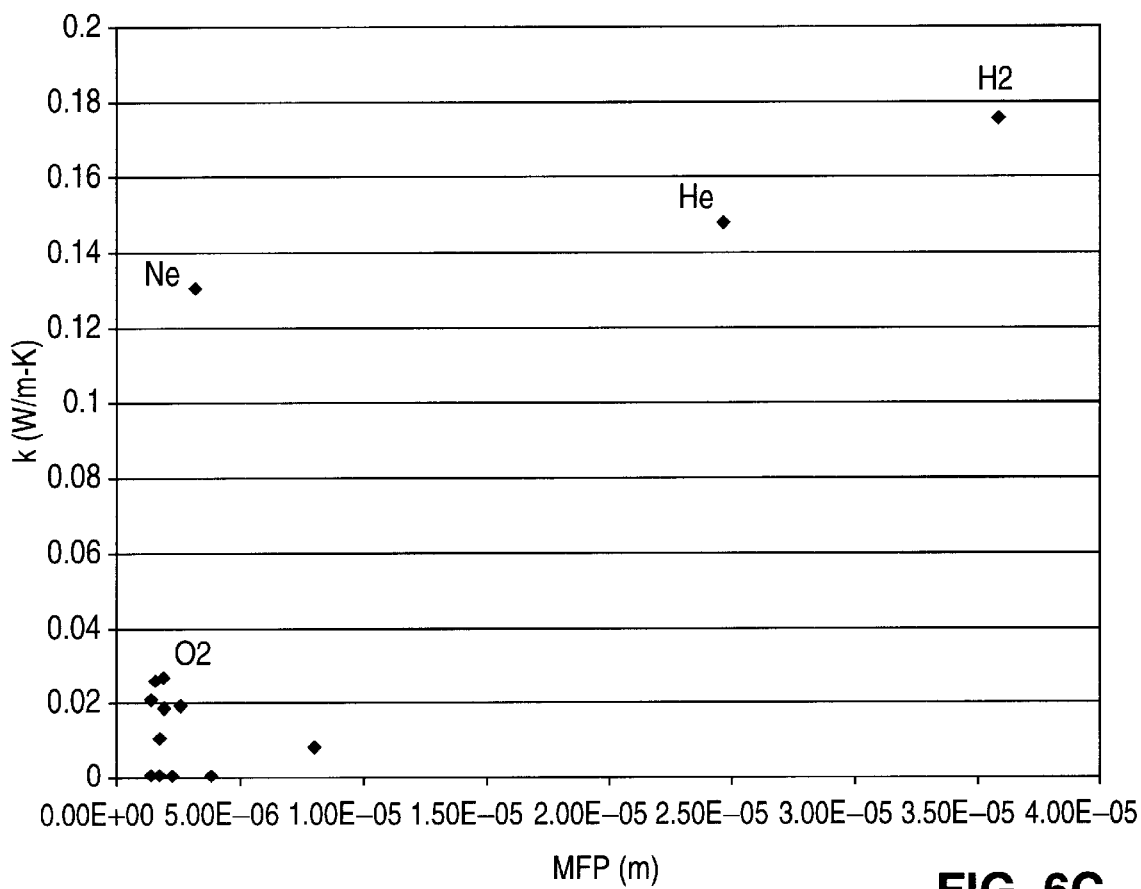
FIG. 6C is a plot of heat transfer coefficient vs. mean free path for several gases at 100 Torr.
Figure 7:
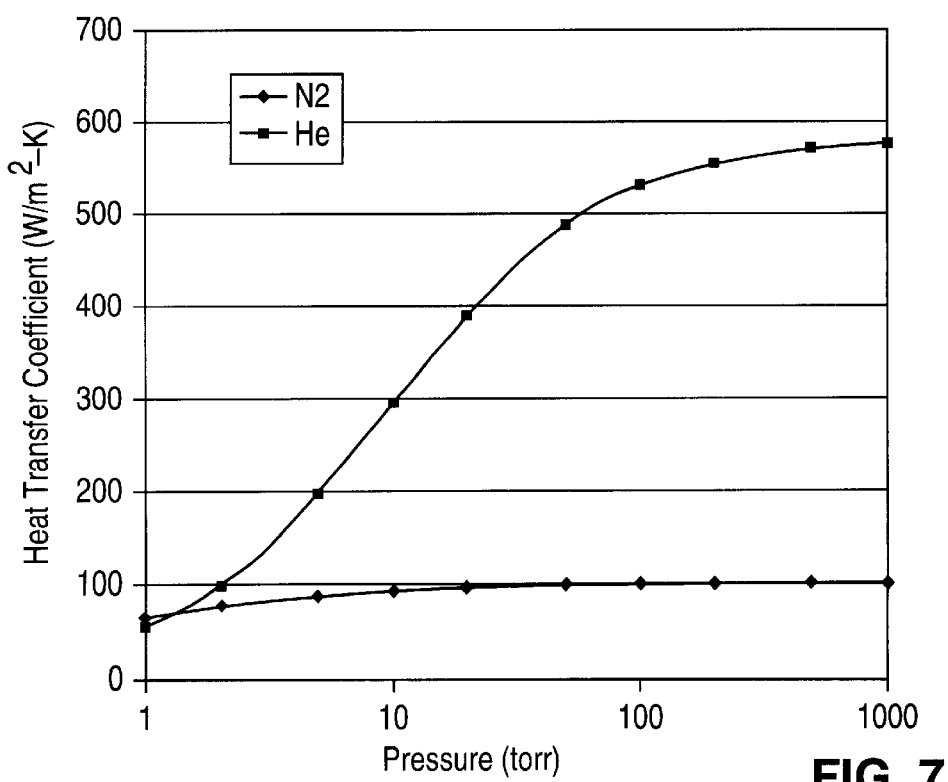
FIG. 7 is a plot of the heat transfer coefficient vs. pressure for nitrogen and helium.

Accordingly, to minimize bowing, the wafer is heated in a gas with high thermal conductivity (i.e. high heat transfer coefficient) and high mean free path compared to oxygen. FIG. 6A illustrates a plot of heat transfer coefficient vs. mean free path for several gases at 2.4 Torr. FIG. 6B illustrates the same properties at 10 Torr and FIG. 6C illustrates the same properties at 100 Torr. In each of FIGS. 6A–6C, the three data points in the top half of the figure represent neon, helium, and hydrogen. The cluster of data points in the bottom half of each figure all represent oxygen. According to FIGS. 6A–6C, helium and diatomic hydrogen are best suited to minimize wafer bowing, as both gases have a high conductivity and high mean free path compared to oxygen or nitrogen. Neon is also appropriate provided the wafer is slightly raised above the pedestal. Further, helium, hydrogen, and neon maintain these desirable properties, i.e. a thermal conductivity and mean free path greater than that of oxygen, as pressure increases. FIG. 7 is a plot of heat transfer coefficient vs. pressure for nitrogen and helium. The heat transfer coefficient of helium increases as pressure increases, making helium suitable for a heat transfer gas even at high pressure.

Figure 3B:
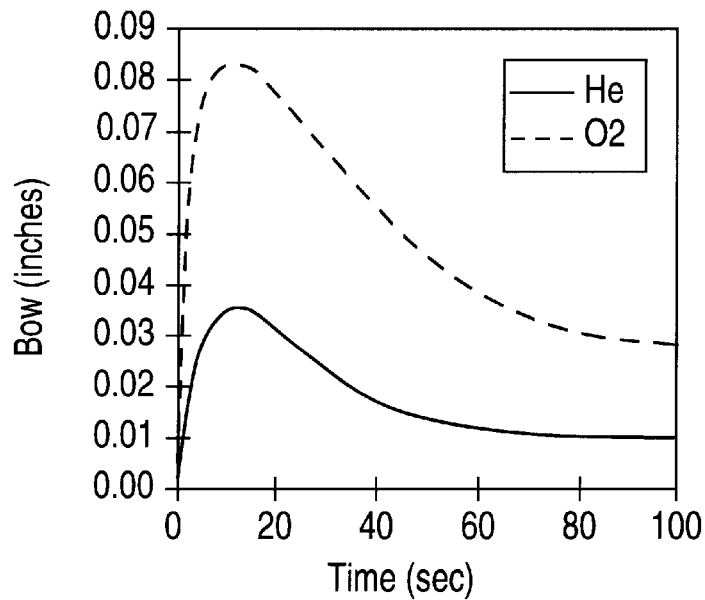
FIG. 3B illustrates the predicted amount of bowing in wafers heated in helium and in oxygen.

FIG. 3B shows plots of the amount of bowing predicted when a wafer is heated in helium and the amount of bowing predicted when a wafer is heated in oxygen. Helium has higher heat conduction compared to nitrogen or oxygen. A wafer heated in oxygen can bow 0.08 inches or more, while a wafer heated in helium will bow less than half that, less than 0.04 inches. The higher heat conduction of helium promotes more uniform heating of the wafer compared to heating the wafer in oxygen. The wafer heated in helium bows less than the wafer heated in oxygen because the wafer heated in helium heats more evenly.

Figure 2A:
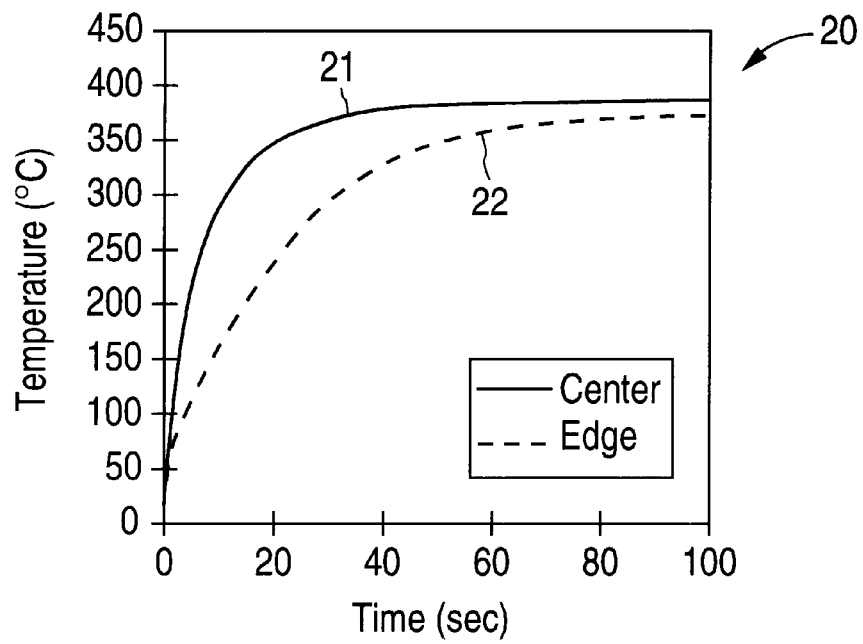
FIG. 2A illustrates the predicted temperature of a wafer at the center and at the edge of the wafer as a function of heating time elapsed.
Figure 2B:
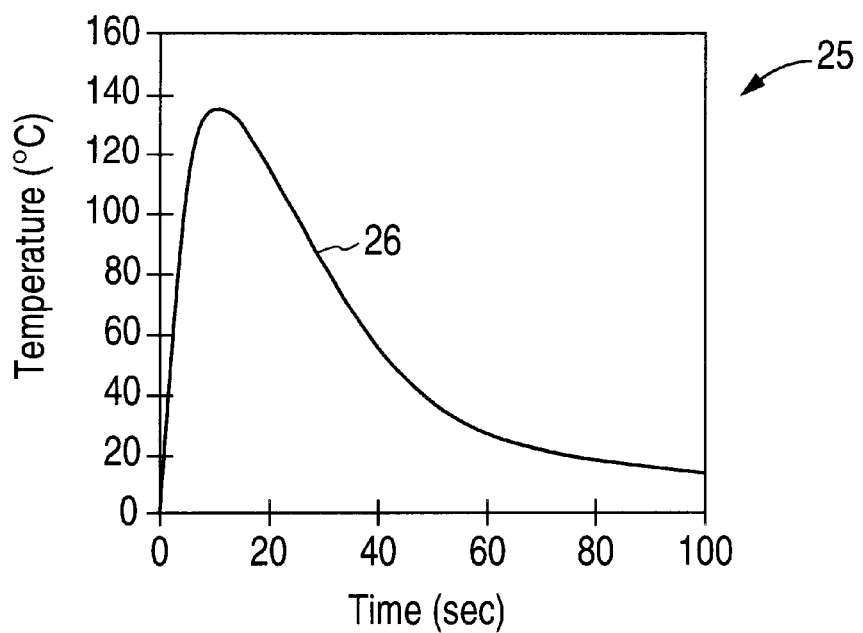
FIG. 2B illustrates the predicted temperature difference between the center and the edge of a heating wafer as a function of heating time elapsed.
Figure 3C:
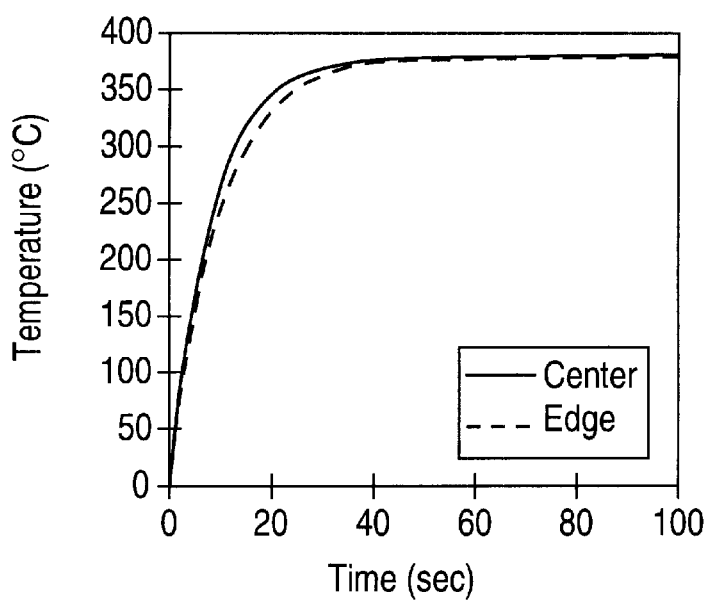
FIG. 3C illustrates the predicted difference between the edge temperature and the center temperature of a wafer heated in helium.

FIG. 3C shows plots of the predicted temperature of the center of a wafer heated in helium and the edge of wafer heated in helium. When heated in helium, the edge of a wafer heats nearly as fast as the center of a wafer. Thus, the temperature difference between the center and the edge is never more than about 25° C. when the wafer is heated in helium. FIG. 2B illustrates that the temperature between the center and the edge of the wafer when the wafer is heated in oxygen can exceed 130° C. Accordingly, helium promotes more uniform heating than oxygen.

FIG. 4A illustrates, in a flowchart, a second embodiment 40 of the invention. In stage 42, a wafer is loaded on the first, heated pedestal in the process chamber. In stage 44, all gases in the process chamber are evacuated until the pressure in the process chamber is less than 100 milliTorr. The wafer is then heated to process temperature in stage 46. After the wafer reaches processing temperature, processing begins in stage 48.

Figure 4B:
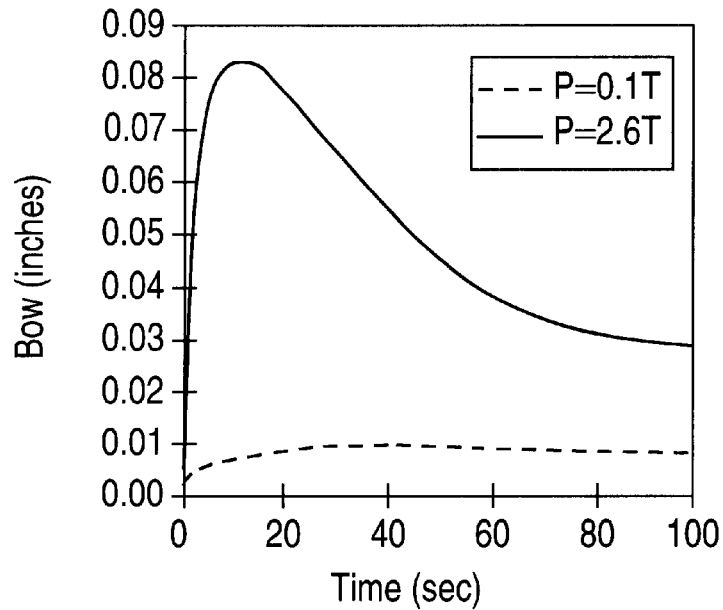
FIG. 4B illustrates the predicted amount of bowing in wafers heated at 2.6 Torr and at 0.1 Torr.

FIG. 4B shows plots of the amount of bowing predicted when a wafer is heated at 2.6 Torr and the amount of bowing predicted when a wafer is heated at 100 mTorr. At 2.6 Torr, the wafer bows an estimated 0.08 inches. In contrast, at 100 mTorr, the wafer bows only an estimated 0.01 inches. The amount of heat transfer is significantly less at a low pressure such as 100 mTorr than at 2.6 Torr, thus the wafer heating is slower and more controlled at 100 mTorr. Controlling the rate of wafer heating results in less bowing. Further, wafers heated at 100 mTorr are estimated to take only 60 to 80 seconds to relax and thus be ready for processing, in contrast to the estimated 80 to 120 seconds required for a wafer heated at 2.6 Torr in oxygen to relax.

Figure 4C:
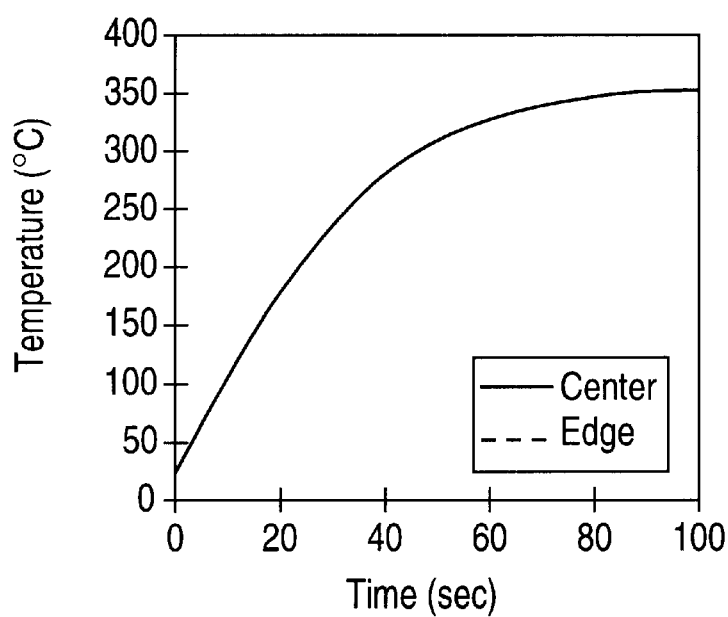
FIG. 4C illustrates the predicted difference between the edge temperature and the center temperature of a wafer heated at 0.1 Torr.

FIG. 4C shows plots of the predicted temperature of the center of a wafer heated at 100 mTorr and the edge of wafer heated at 100 mTorr. When heated at 100 mTorr, the edge of a wafer heats nearly as fast as the center of a wafer. Thus, there is little difference between the temperature at the center of the wafer and the temperature at the edge of the wafer. Accordingly, heating at low pressure promotes uniform heating of the wafer which reduces bowing.

The above-described embodiments may be used with, for example, the SEQUEL™ multistation deposition system, the INOVA™ PVD system, and the VECTOR™ PECVD system, all available from the assignee of the present invention.

FIG. 5 is a schematic diagram of a processing chamber 100, suitable for implementing the present invention. Processing chamber 100 includes a gas inlet showerhead 102 with face plate 104, a pedestal 106, and an annular pumping port 110. Annular pumping port 110 is connected to a vacuum pump 112 that is used to pump gas out of chamber 100. Showerhead 102 is connected to a gas source 114 via valve 116. Gas source 114 supplies a gas to the front side of a substrate located on pedestal 106 via showerhead face plate 104 during substrate processing. Gas source 114 also provides a cleaning gas by way of showerhead 102. During cleaning there is no substrate located on pedestal 106, and thus the cleaning gas flows unimpeded into chamber 100.

Showerhead 102 and pedestal 106 may be electrically connected to an RF power source 124, such that chuck 106 and showerhead 102 act as an anode and cathode, respectively. In addition, thermocouples are connected to pedestal 106. The temperature controller 126 provides power to embedded heater elements within pedestal 106. Using the thermocouples, active temperature control is maintained for wafer processing. Pedestal temperatures are kept at 400° C. or lower, depending on the process.

A substrate (not shown), such as a semiconductor wafer, is automatically loaded into chamber 100 by an automatic transportation mechanism (not shown). The substrate is then placed on lift pins on pedestal 106 to hold the substrate slightly above pedestal 106. High thermal conductivity gases for heating the substrate are supplied to the interior of chamber 100 from gas supply 114 and showerhead 102. The heating gas flows through small holes in face plate 104 and over the surface of the substrate. The gas diffuses through the space created by the lift pins to the back side of the wafer. The heating elements in the pedestal heat the wafer. When heating is complete, vacuum pump 112 is used to pump the heating gas from chamber 100 through annular pumping port 110.

Table 2 illustrates the results of tests of the two embodiments described above. "Yes" indicates that the wafer did bow. "No" indicates that the wafer did not bow. "N/A" indicates that the wafer did not seat properly on the pedestal.

TABLE 2

| Did the wafer bow? Wafer Number | Heating at 2.4 Torr in N$_2$ | Heating at 2.4 Torr in He | Heating at 0.1 Torr in N$_2$ |
| --- | --- | --- | --- |
| 1 | N/A | No | No |
| 2 | No | No | No |
| 3 | No | No | No |
| 4 | N/A | No | No |
| 5 | No | No | No |
| 6 | Yes | No | N/A |
| 7 | No | No | N/A |
| 8 | Yes | No | No |
| 9 | Yes | No | N/A |
| 10 | No | No | No |
| 11 | Yes | No | No |
| 12 | Yes | No | No |
| 13 | Yes | No | No |

Nearly half the wafers bowed when heated at 2.4 Torr in Nitrogen. In contrast, none of the wafers bowed when heated according to the method described above.

In accordance with the present invention, heating a semiconductor wafer in a high thermal conductivity gas, instead of in oxygen or nitrogen, results in significantly less bowing than a wafer heated in nitrogen or oxygen. Also, heating a semiconductor wafer at a pressure less than or equal to 0.1 Torr results in significantly less bowing than heating a wafer at 2.4 Torr. Thus, the wafer will not bow, and the time required for a wafer to relax and fully heat until it is flat is not required.

Various modifications and adaptations of the embodiments and implementations described herein are encompassed by the attached claims. For example, the invention is not limited to using helium as a high thermal conductivity gas. The invention may be implemented using other gases or mixtures of helium and other gases. Similarly, the invention is not limited to the particular processing conditions described herein. Further, the invention is not limited to use in the processing chamber. The invention may be used in other chambers of a wafer processing system, for example, a load lock. The invention is set forth in the following claims.

We claim:

1. A method of heating a semiconductor wafer, the method comprising:
   introducing a gas into a processing chamber at a rate less than or equal to 10 liters per minute, wherein the gas has a greater thermal conductivity and a greater mean free path than oxygen;
   loading the semiconductor wafer onto a pedestal in the processing chamber, such that a gap exists between the semiconductor wafer and the pedestal; and
   heating the pedestal;
   the semiconductor wafer being heated by heat flux via the gas in the gap between the semiconductor wafer and the pedestal.

2. The method of claim 1 further comprising, after said heating, evacuating the gas from the processing chamber.

3. The method of claim 1 wherein the gas is selected from a group consisting of helium, hydrogen, and neon.

4. The method of claim 1 wherein said introducing comprises introducing gas into the processing chamber to a pressure less than or equal to 2.4 Torr.

5. The method of claim 1 wherein said introducing comprises introducing the gas into the processing chamber above the semiconductor wafer.

6. A method of heating a semiconductor wafer, the method comprising:

introducing a gas into a processing chamber at a rate less than or equal to 10 liters per minute, wherein the gas has a greater thermal conductivity and a greater mean free path than oxygen;

loading the semiconductor wafer onto a pedestal in the processing chamber; and heating the pedestal.

7. The method of claim 6 further comprising, after said heating, evacuating the gas from the processing chamber.

8. The method of claim 6 wherein the gas is selected from a group consisting of helium, hydrogen, and neon.

9. The method of claim 6 wherein said introducing comprises introducing gas into the processing chamber to a pressure less than or equal to 2.4 Torr.

10. The method of claim 6 wherein said introducing comprises introducing the gas into the processing chamber above the semiconductor wafer.

11. The method of any one of claims 1 or 6 wherein the pedestal is heated to a temperature of less than or equal to 400° C.

12. The method of any one of claims 1 or 6 wherein the chamber is selected from a group consisting a chamber of a multi-station deposition system, a chamber of a physical vapor deposition system, and a chamber of a plasma enhanced chemical vapor deposition system.

* * * * *